(12) United States Patent
Chang et al.

(10) Patent No.: US 7,940,543 B2
(45) Date of Patent: May 10, 2011

(54) LOW POWER SYNCHRONOUS MEMORY COMMAND ADDRESS SCHEME

(75) Inventors: Chia-Jen Chang, Houston, TX (US); Phat Truong, Houston, TX (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 237 days.

(21) Appl. No.: 12/050,950

(22) Filed: Mar. 19, 2008

(65) Prior Publication Data
US 2009/0238014 A1    Sep. 24, 2009

(51) Int. Cl.
*G11C 5/00* (2006.01)
*G11C 7/00* (2006.01)

(52) U.S. Cl. ............... 365/52; 365/189.05; 365/194; 365/230.06; 365/230.08; 365/233.1; 365/233.13

(58) Field of Classification Search ............. 365/52, 365/233.1, 233.13, 194, 230.03, 189.05, 365/230.06, 230.08
See application file for complete search history.

(56) References Cited

U.S. PATENT DOCUMENTS

| | | | |
|---|---|---|---|
| 5,953,286 A * | 9/1999 | Matsubara et al. | 365/233.1 |
| 6,404,684 B2 * | 6/2002 | Arimoto et al. | 365/233.13 |
| 6,438,066 B1 * | 8/2002 | Ooishi et al. | 365/233.13 |
| 6,445,643 B2 * | 9/2002 | Keeth et al. | 365/233.13 |
| 6,650,573 B2 * | 11/2003 | Sunaga et al. | 365/233.13 |
| 6,717,886 B2 * | 4/2004 | Pramod et al. | 365/194 |
| 6,772,312 B2 * | 8/2004 | Mes | 365/233.13 |
| 6,804,165 B2 * | 10/2004 | Schrogmeier et al. | 365/194 |
| 6,826,113 B2 * | 11/2004 | Ellis et al. | 365/233.13 |
| 6,944,092 B2 * | 9/2005 | Kang | 365/233.13 |
| 7,085,192 B2 * | 8/2006 | Fujisawa et al. | 365/233.13 |
| 7,170,813 B2 * | 1/2007 | Minzoni | 365/194 |
| 7,447,109 B2 * | 11/2008 | Takano et al. | 365/233.13 |
| 7,453,738 B2 * | 11/2008 | Taruishi et al. | 365/233.13 |
| 7,464,231 B2 * | 12/2008 | Raad | 365/233.13 |
| 7,509,469 B2 * | 3/2009 | Mes | 365/233.13 |
| 7,529,112 B2 * | 5/2009 | Dreps et al. | 365/52 |
| 7,590,013 B2 * | 9/2009 | Yu et al. | 365/233.13 |
| 7,613,069 B2 * | 11/2009 | Yang | 365/233.13 |
| 7,660,187 B2 * | 2/2010 | Johnson et al. | 365/194 |

FOREIGN PATENT DOCUMENTS
CN       1627521 A       6/2005
* cited by examiner

*Primary Examiner* — Trong Phan
(74) *Attorney, Agent, or Firm* — Winston Hsu; Scott Margo

(57) ABSTRACT

A method for dynamically enabling address receivers in a synchronous memory array includes: controlling all address receivers to initially be in an off state; generating a command signal and generating an address signal; delaying the address signal so there is a latency between the command signal and the address signal; and selectively turning on an address receiver corresponding to the address signal when the command signal is received by the synchronous memory array.

7 Claims, 3 Drawing Sheets

LOW POWER SYNCHRONOUS MEMORY COMMAND ADDRESS SCHEME

BACKGROUND OF THE INVENTION

1. Field of the Invention

The present invention relates to synchronous memory, and in particular to a synchronous memory that can dynamically enable address receivers.

2. Description of the Prior Art

Synchronous memory has simpler timing requirements than asynchronous memory, which has to generate a pulse every time a write operation occurs. Synchronous memory has signals that operate on clock edges, and therefore can operate at a much faster frequency than asynchronous memory. In a multiple bank memory with a shared address scheme, such as a Double Data Rate-4 (DDR4) memory, address signals input to a specific bank can produce a transient current to other banks A conventional method therefore introduces decoding logic to selectively latch or release addresses to an internal address bus.

Please refer to FIG. 1, which is a diagram of a synchronous memory 100 according to the prior art. As can be seen from the diagram, the synchronous memory 100 has a clock receiver 130 for receiving a clock signal, a command receiver 120 for receiving a command signal (CMD1, CMD2, CMD3 etc.) and an address receiver 110 for receiving an address signal (ADD1, ADD2, ADD3 etc.). Only one set of receivers is shown here for simplicity. As can be seen from the timing diagram in FIG. 1, the command signal and address signal are received by the command receiver 120 and the address receiver 110 respectively in a same clock cycle. The command signal is decoded utilizing the aforementioned decoding logic to generate a command clock CMD_CLK for latching or releasing the address signal to the internal address bus. The address signal will first be buffered in the buffer 152 before being released to the internal address bus.

As the address signal and command signal are received in the same clock cycle, the address receivers need to be permanently 'on'. This consumes considerable power. Therefore, providing a system for selectively turning on address receivers when they are required to be operational is desired.

SUMMARY OF THE INVENTION

The present invention provides a system and method for dynamically turning on address receivers according to received commands.

A method for dynamically enabling address receivers in a synchronous memory array, comprises: controlling all address receivers to initially be in an off state; generating a command signal and generating an address signal; delaying the address signal so there is a latency between the command signal and the address signal; and selectively turning on an address receiver corresponding to the address signal when the command signal is received by the synchronous memory array. The method further comprises providing a system clock; decoding the command signal according to the system clock to selectively generate an address receiver enable signal; and turning on the address receiver according to the address receiver enable signal.

A synchronous memory array is provided, comprising: a command receiver, for receiving a command signal; an address receiver, for receiving an address signal corresponding to the command signal where the address signal is delayed with respect to the command signal and the address receiver is initially in an off state; and a decoder, coupled to the command receiver and the address receiver, for decoding the command signal to selectively generate a receiver enable signal for turning on the address receiver.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a method for dynamically enabling address receivers in a synchronous memory.

Figure 1:
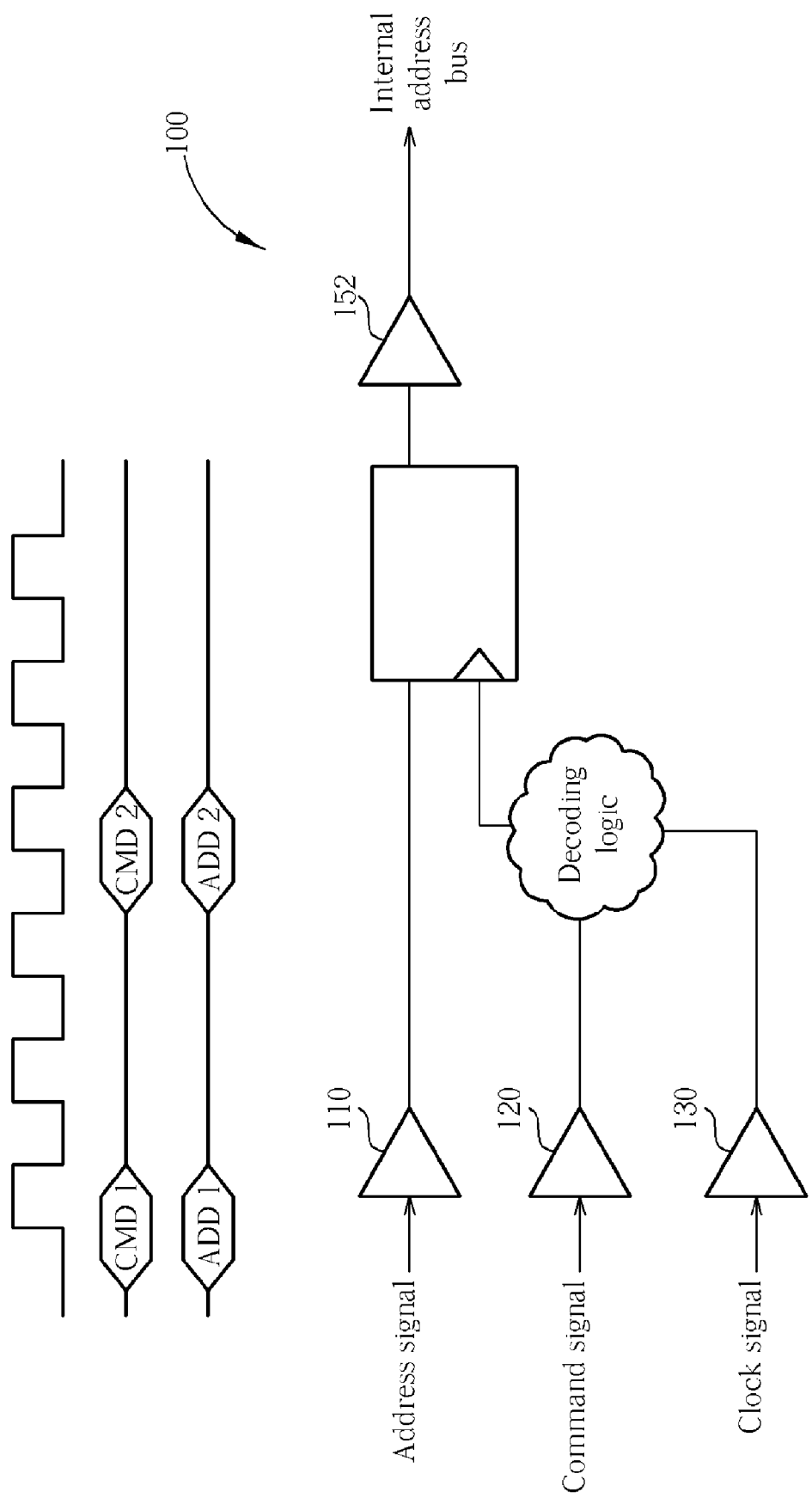
FIG. 1 is a diagram of an operation of a conventional synchronous memory.
Figure 2:
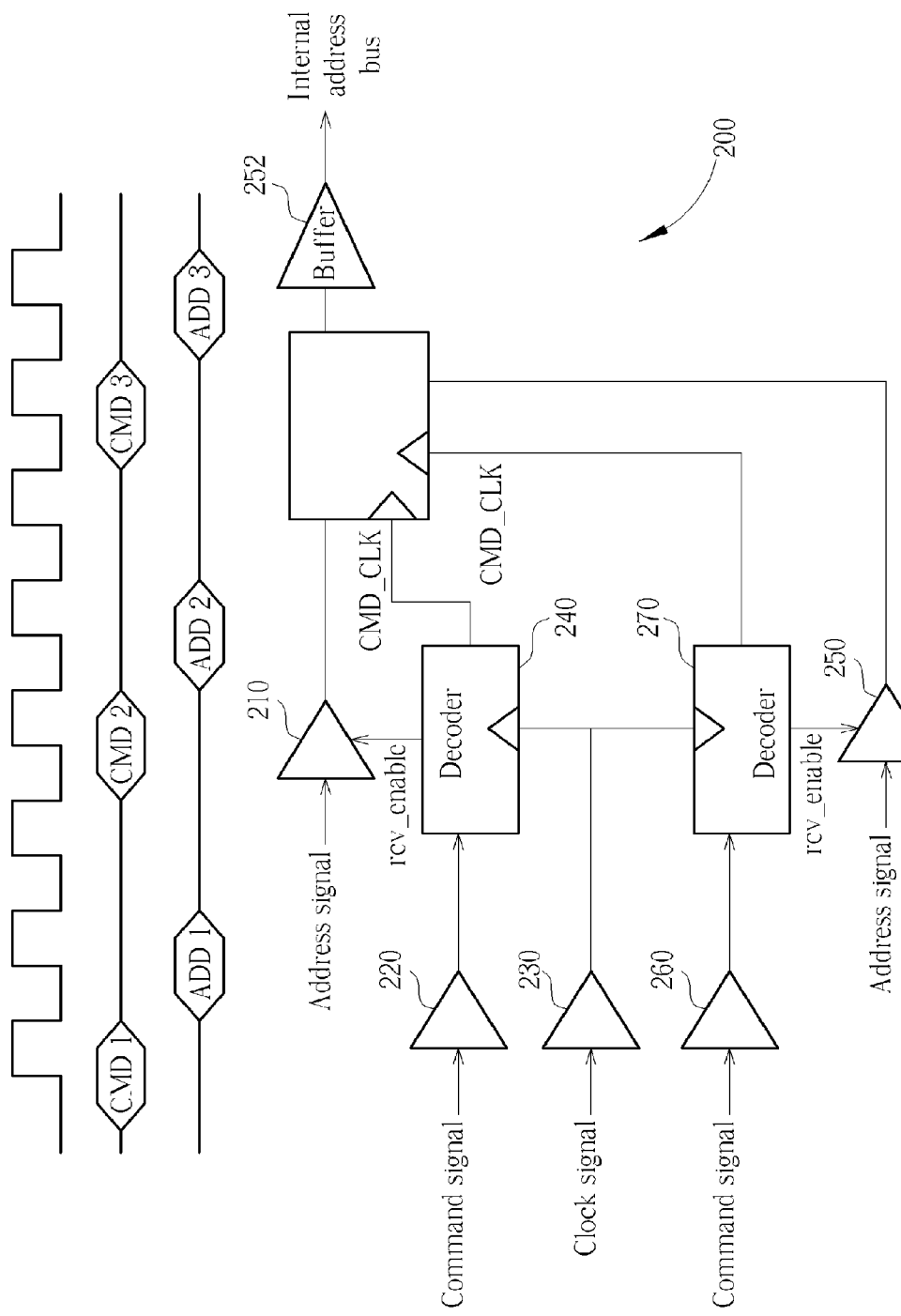
FIG. 2 is a diagram of a synchronous memory according to an exemplary embodiment of the present invention.

Please refer to FIG. 2. FIG. 2 is a diagram of a synchronous memory 200 according to an exemplary embodiment of the present invention. The synchronous memory 200 comprises a first set of receivers comprising an address receiver 210 for receiving a series of address signals ADD1, ADD2, ADD3 etc., a command receiver 220 for receiving a series of corresponding command signals CMD1, CMD2, CMD3 etc., and a clock receiver 230 for receiving a clock signal. The clock signal is generated by a system clock. The address receiver 210, command receiver 220 and clock receiver 230 are coupled to a decoder 240. The decoder 240 and address receiver 210 are further coupled to a buffer 252, which is coupled in turn to an internal address bus. The synchronous memory 200 also comprises at least a second set of receivers comprising an address receiver 250 and a command receiver 260 (please note that only two sets of address receivers are shown for simplicity). The address receiver 250 and command receiver 260 are coupled to a decoder 270, which is also coupled to the buffer 252 and the internal address bus. Operation of components in the second set of receivers is the same as that in the first set of receivers. Please note that the timing diagram in the figure can apply to both the first set and the second set of receivers.

As can be seen from the timing diagram in FIG. 2, the address signal is received a clock cycle later than the command signal. This is achieved by delaying the address signal according to the system clock. Please note that the address signal being delayed by one clock cycle only is shown here to illustrate the feature of the present invention but is not a limitation of the present invention. The address signal can be delayed by latching the address signal utilizing the system clock, buffering the address signal, inputting the address signal to a delay circuit etc. All methods of delaying the address signal so there is a latency between the address signal and the command signal fall within the scope of the present invention.

Initially, all address receivers of the synchronous memory 200 are controlled to be in an 'off' state. The command signal and address signal are generated and the address signal is delayed according to the system clock so that there is a latency between the command signal and the address signal. As in the conventional art, the command signal has logic information to be decoded to produce a command clock CMD_CLK, but in the present invention the command signal also includes logic information relating to whether the address receiver 210 needs to be enabled or not. The command signal is input to the decoder 240, which generates CMD_CLK and a receiver enable signal rcv_enable. If the decoded command signal indicates that the address receiver 210 does not need to be enabled then no receiver enable signal will be generated.

Ideally, the latency between the address signal and the command signal is according to a time taken by the decoder 240 to generate the receiver enable signal rcv_enable and power on the address receiver 210. In this way, a performance impact caused by powering on address receivers can be minimized.

After the address signal has been released to the internal address bus according to the command clock CMD_CLK, the address receiver 210 can again be powered off, provided no command signals are received in the interim. A next command signal will then be input to the decoder 240 for determining whether or not to power on the address receiver 210 once more.

Figure 3:
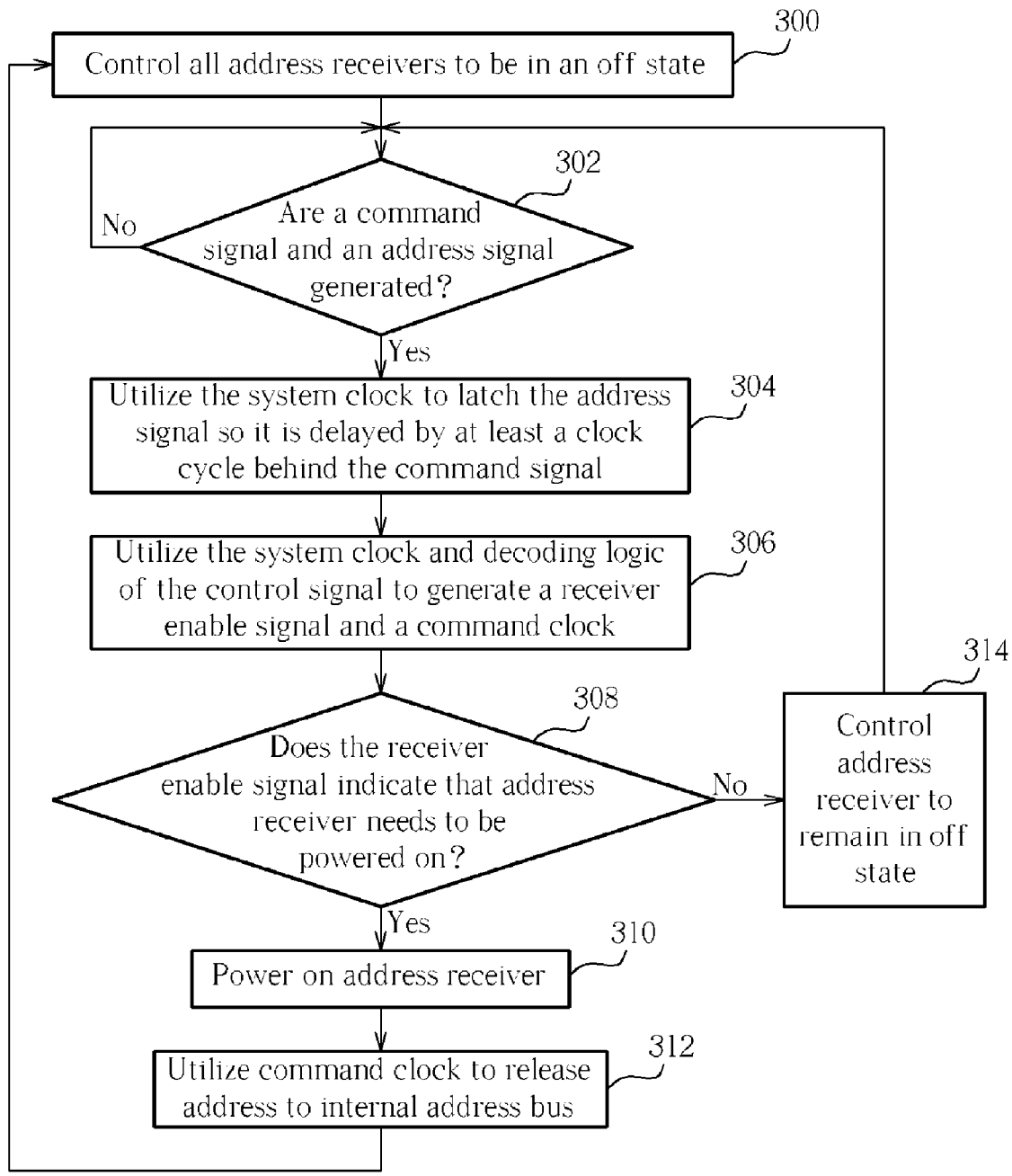
FIG. 3 is a flowchart of the operation of the synchronous memory shown in FIG. 2.

The method of the present invention will be detailed herein with reference to FIG. 3, which is a flowchart illustrating the steps of the invention. The steps are as follows:

Step 300: Control all address receivers to be in an off state.

Step 302: Are a command signal and an address signal generated? If yes go to Step 304, if no return to Step 302;

Step 304: Utilize the system clock to latch the address signal so it is delayed by at least a clock cycle behind the command signal.

Step 306: Utilize the system clock and decoding logic of the control signal to generate a receiver enable signal and a command clock.

Step 308: Does the receiver enable signal indicate that address receiver needs to be powered on? If yes go to Step 310; if no go to Step 314.

Step 310: Power on address receiver

Step 312: Utilize command clock to release address to internal address bus and return to Step 300.

Step 314: Control address receiver to remain in off state and return to Step 302.

As the address signal is delayed in relation to a corresponding command signal, the address receivers do not need to be in a permanent 'on' state, and can be dynamically powered on according to the command signal logic information. Therefore, current consumed by conventional address receivers can be saved.

Those skilled in the art will readily observe that numerous modifications and alterations of the device and method may be made while retaining the teachings of the invention.

What is claimed is:

1. A method for dynamically enabling address receivers in a synchronous memory array, the method comprising:
   controlling all address receivers to initially be in an off state;
   generating a command signal and generating an address signal;
   delaying the address signal so there is a latency between the command signal and the address signal; and
   selectively turning on an address receiver corresponding to the address signal when the command signal is received by the synchronous memory array.

2. The method of claim 1, wherein the step of selectively turning on the address receiver corresponding to the address signal comprises:
   providing a system clock;
   decoding the command signal according to the system clock to selectively generate an address receiver enable signal; and
   turning on the address receiver according to the address receiver enable signal.

3. The method of claim 2, wherein if the decoded command signal indicates that the address receiver must be enabled the address receiver enable signal will be generated and if the decoded command signal indicates that the address receiver does not need to be enabled the address receiver enable signal will not be generated.

4. The method of claim 2, wherein the latency between the address signal and the command signal is according to a decoding time of the command signal.

5. The method of claim 1, wherein the step of delaying the address signal comprises:
   providing a system clock; and
   latching the address signal for at least a clock cycle of the system clock.

6. The method of claim 1, wherein the synchronous memory array complies with a Double Data Rate-4 (DDR4) specification.

7. The method of claim 1, further comprising:
   turning the address receiver off after a predetermined time period in which no further command signal for the address receiver is received.

* * * * *